(12) United States Patent
Kasuya et al.

(10) Patent No.: US 7,212,036 B2
(45) Date of Patent: May 1, 2007

(54) DRIVING APPARATUS OF H BRIDGE CIRCUIT AND PROTECTION METHOD OF THE SAME

(75) Inventors: Hirokazu Kasuya, Nukata-gun (JP); Koji Numazaki, Nukata-gun (JP); Mitsuhiro Saitou, Obu (JP); Yutaka Fukuda, Kariya (JP); Nobumasa Ueda, Nagoya (JP)

(73) Assignee: Denso Corporation, Kariya (JP)

( * ) Notice: Subject to any disclaimer, the term of this patent is extended or adjusted under 35 U.S.C. 154(b) by 130 days.

(21) Appl. No.: 11/057,786

(22) Filed: Feb. 15, 2005

(65) Prior Publication Data

US 2005/0179463 A1    Aug. 18, 2005

(30) Foreign Application Priority Data

Feb. 16, 2004  (JP)  ............................. 2004-038138
Nov. 16, 2004  (JP)  ............................. 2004-331940

(51) Int. Cl.
*H03K 19/0175* (2006.01)

(52) U.S. Cl. .......................................... 326/83; 318/4

(58) Field of Classification Search ............ 326/80–86; 318/34, 599
See application file for complete search history.

(56) References Cited

U.S. PATENT DOCUMENTS

| 6,385,028 | B1  |   | 5/2002 | Kouno |
| 6,545,886 | B1  | * | 4/2003 | Ireland ................... 363/56.02 |
| 6,940,144 | B2  | * | 9/2005 | Nakayama ................. 257/502 |
| 7,023,152 | B2  | * | 4/2006 | Sunaga et al. ............... 318/34 |

FOREIGN PATENT DOCUMENTS

JP          A-11-341851         12/1999

* cited by examiner

*Primary Examiner*—Don Le
(74) *Attorney, Agent, or Firm*—Posz Law Group, PLC

(57) ABSTRACT

In order to protect semiconductor switching-devices employed in an H bridge circuit against an over-voltage without using a special protection circuit, a control circuit outputs a control signal to a driving circuit for driving the H bridge circuit in order to turn off FETs serving as the semiconductor switching-devices when an over-voltage detection circuit detects the over-voltage applied to the H bridge circuit.

4 Claims, 9 Drawing Sheets

DRIVING APPARATUS OF H BRIDGE CIRCUIT AND PROTECTION METHOD OF THE SAME

CROSS REFERENCE TO RELATED APPLICATIONS

This application is based upon, claims the benefit of priority of, and incorporates by reference the contents of, Japanese Patent Application No. 2004-38138 filed on Feb. 16, 2004 and Japanese Patent Application No. 2004-331940 filed on Nov. 16, 2004.

FIELD OF THE INVENTION

The present invention relates to an apparatus for driving an H bridge circuit and to a method to protect the H bridge circuit.

BACKGROUND OF THE INVENTION

Recently, efforts have been made to increase the number of functions in a car and to make the car more luxurious. In order to implement the functions, an actuator such as a motor is provided at every portion of the car. Accordingly, a larger number of actuators are employed. Development of a small-size and low-cost actuator ECU (Electronic Control Unit) capable of controlling a large power to address such a situation is expected.

An H bridge circuit comprising four semiconductor switching-devices is employed in a number of cases as a circuit for driving the above actuator. A power transistor is typically employed as a semiconductor switching circuit. In general, a power transistor is required to have a noise-proof characteristic. In particular, since a power transistor mounted on a car is required to have a surge-proof characteristic, a power transistor having a high withstand voltage is employed. However, a power transistor having a high withstand voltage is built in a chip having a large size, which prevents miniaturization. In addition, since a power transistor with a high withstand voltage has a large on-resistance, heat is dissipated in a switching operation so that a countermeasure for coping with the dissipated heat must be devised. As a result, the use of such a power transistor is cumbersome.

In order to improve the surge-proof characteristic without employing a semiconductor switching-device having a high withstand voltage, the use of a circuit for carrying out protection in the event of a detected surge voltage is conceivable. For example, Japanese Patent Laid-open No. 11-341851 (referred to as patent reference 1), the contents of which are incorporated herein by reference, discloses a technology provided for a motor driven by an H bridge circuit. In accordance with this technology, the existence of an abnormality is confirmed when a voltage appearing at a power supply side terminal is not higher than a predetermined fraction of the voltage of a battery serving as the power supply or when a voltage appearing at a ground side terminal is not lower than another predetermined fraction of the voltage of the power supply and, in the event of such an abnormality, an operation to supply power from the battery to the motor is discontinued.

However, the technology disclosed in patent reference 1 has a configuration in which an abnormality of a motor is detected on the assumption that the voltage of the power supply is normal. Thus, the technology is not suitable for an application to protect semiconductor switching-devices employed in an H bridge circuit against a surge voltage caused by an excessive increase in power-supply voltage. For example, in accordance with the technology disclosed in patent reference 1, when existence of an abnormality in a motor is confirmed, a protection circuit cuts off the power supply path to the motor. However, the protection circuit requires a relay when semiconductor switching-devices are also to be protected against a large power caused by an applied surge voltage. Even if a relay is employed, however, the relay may not be capable of cutting off the path of a large current quickly with ease when the large current flows. In order to solve this problem, an expensive relay must be used. In addition, the use of a relay raises another problem of a configuration of large size.

SUMMARY OF THE INVENTION

It is thus an object to provide a driving apparatus capable of protecting semiconductor switching-devices employed in an H bridge circuit without using a special protection circuit and to provide a method of protecting the H bridge circuit, both of which address the problems described above.

In accordance with a driving apparatus for an H bridge circuit according to a first aspect, a control circuit controls a driving circuit to output a driving signal to all of semiconductor switching-devices employed in the H bridge circuit to put the semiconductor switching-devices in an electrically non-conductive state when an over-voltage applied to the H bridge circuit is detected. With the semiconductor switching-devices put in an electrically non-conductive state in the event of an over-voltage, each of the semiconductor switching-devices needs to bear only ½ the magnitude of the over-voltage so that the semiconductor switching-devices can be protected against the over-voltage without using a special protection circuit. In addition, the size and cost of the protection mechanism can be reduced. Further, since the withstand voltage of every semiconductor switching-device does not have to be raised to match higher over-voltages, the on-resistance of the semiconductor switching-device does not rise. Therefore, the amount of heat dissipated in a normal operation of the H bridge circuit can be suppressed.

In accordance with a driving apparatus for an H bridge circuit according to a second aspect, the driving apparatus employs a control circuit implemented by hardware. Thus, the semiconductor switching-devices can be protected very quickly in the event of a detected over-voltage.

In accordance with a driving apparatus for an H bridge circuit according to a third aspect, the H bridge circuit is a circuit for driving a motor mounted on a vehicle. Thus, the driving apparatus is suitable for such a motor. That is, even though the inside of the vehicle is an environment prone to a surge voltage generated relatively with ease in a power-supply system of a battery, the driving apparatus is capable of preventing the semiconductor switching-devices from being damaged in the event of a surge voltage applied to the power-supply system in such an environment.

In accordance with a driving apparatus for an H bridge circuit according to a fourth aspect, the H bridge circuit employs a P-channel MOSFET as a semiconductor switching-device provided on the side of a power supply and, when an over-voltage detection circuit detects an over-voltage, a driving device employed on the power supply side in a driver circuit for driving the P-channel MOSFET is put in an electrically conductive state. Thus, an electric potential appearing at the gate of the P-channel MOSFET can be lowered from the over-voltage applied to the power supply by a voltage drop generated by the electrically conductive state of the driving device employed on the side of the power supply. Since the electric potential appearing at the gate of the P-channel MOSFET is set at a cut-off level established in this way, the P-channel MOSFET can be put in an electrically conductive state with a high degree of reliability. A driving device employed on the ground side in the driver circuit as a device for driving the P-channel MOSFET is put in an electrically non-conductive state when the over-voltage detection circuit detects an over-voltage. In this state, the driving device on the ground side bears a voltage applied between the terminals of the driving device. The voltage applied to the terminals of the driving device provided on the ground side is an electric potential appearing at the gate of the P-channel MOSFET. Thus, an operation to protect the P-channel MOSFET against an over-voltage lower than the withstand voltage of the driving device provided on the side of the ground can be carried out.

In accordance with a driving apparatus for an H bridge circuit according to a fifth aspect, even with the driving device on the side of the ground put in an electrically non-conductive state in the event of a detected over-voltage, a Zener diode wired to the driving device provided on the side of the ground is turned on when the voltage applied to a power-supply-side terminal of the driving device exceeds the Zener voltage of the Zener diode. Thus, the driving device provided on the side of the ground can be protected with a high degree of reliability by never applying a voltage exceeding the withstand voltage of the driving device to the driving device.

In accordance with a driving apparatus for an H bridge circuit according to a sixth embodiment, when the Zener diode attached to the driving device provided on the side of the ground is turned on as described above, allowing a current to flow through the Zener diode, the current also flows through a resistor connected between the driving device on the side of the power supply and the driving device on the side of the ground. A voltage drop generated by the resistor relieves the Zener diode and the driving device provided on the side of the ground from the over-voltage so that the driving circuit and the Zener diode may have a lower withstand voltage and a lower Zener diode respectively.

In accordance with a driving apparatus for an H bridge circuit according to a seventh aspect, a first switching device, a second switching device and the driving device provided on the side of the power supply are put in an electrically conductive state in the event of a detected over-voltage. In this state, an electric potential appearing at the gate of the P-channel MOSFET is firmly set at a cut-off level lower than the over-voltage applied to the power supply by a difference equal to a voltage drop, which is caused by the electrical conductions of the second switching device and the driving device provided on the side of the power supply. Thus, the P-channel MOSFET is put in an electrically non-conductive state with a high degree of reliability.

In addition, when an over-voltage is detected, a voltage lower than the over voltage by a voltage difference equal to the sum of a voltage drop equal to the Zener voltage of a first Zener diode connected between a power-supply-side terminal and electrical-conduction control terminal of the first switching device and a voltage drop equal to the Zener voltage of a second Zener diode connected between a power-supply-side terminal and electrical-conduction control terminal of the second switching device is applied to an output terminal of a device for driving the first switching device. Thus, the device for driving the first switching device is relieved from the over-voltage by the voltage difference. Further, the clamp operations of the first and second Zener diodes also protect the first and second switching devices respectively.

In accordance with a driving apparatus for an H bridge circuit according to an eighth aspect, the over-voltage detection circuit includes a Zener diode, which electrically conducts and puts a cutoff control device employed in the control circuit in an electrically conductive state when a voltage higher than the Zener voltage of the diode is applied to the diode. Thus, a signal supplied to a control-signal input terminal of the driving circuit is set at the level required to put the P-channel MOSFET in an electrically non-conductive state. As a result, the driving circuit is capable of carrying out an operation to put the P-channel MOSFET in an electrically non-conductive state.

In accordance with a driving apparatus for an H bridge circuit according to a ninth aspect, a level detected by the over-voltage detection circuit as a level of an over-voltage is set at a value exceeding the withstand voltage of every semiconductor switching-device employed in the H bridge circuit. That is, even if a level detected by the over-voltage detection circuit as a level of an over-voltage is set as described above, the driving circuit is capable of carrying out a protection operation immediately to prevent the semiconductor switching-devices from being damaged. In addition, by setting the detection level at a high value, the protection operation can be prevented from being carried out frequently.

In accordance with a driving apparatus for an H bridge circuit according to a tenth aspect, at least, each device employed in the driving circuit has a configuration of the form comprising a trench separation structure added to an SOI structure. Since such a device has a high withstand voltage in comparison with that having the junction separation structure, the device is suitable for use in the driving circuit provided of the present invention.

BRIEF DESCRIPTION OF THE DRAWINGS

The above and other objects, features and advantages of the present invention will become more apparent from the following detailed description made with reference to the accompanying drawings.

PREFERRED EMBODIMENTS OF THE INVENTION

First Embodiment

Figure 1:
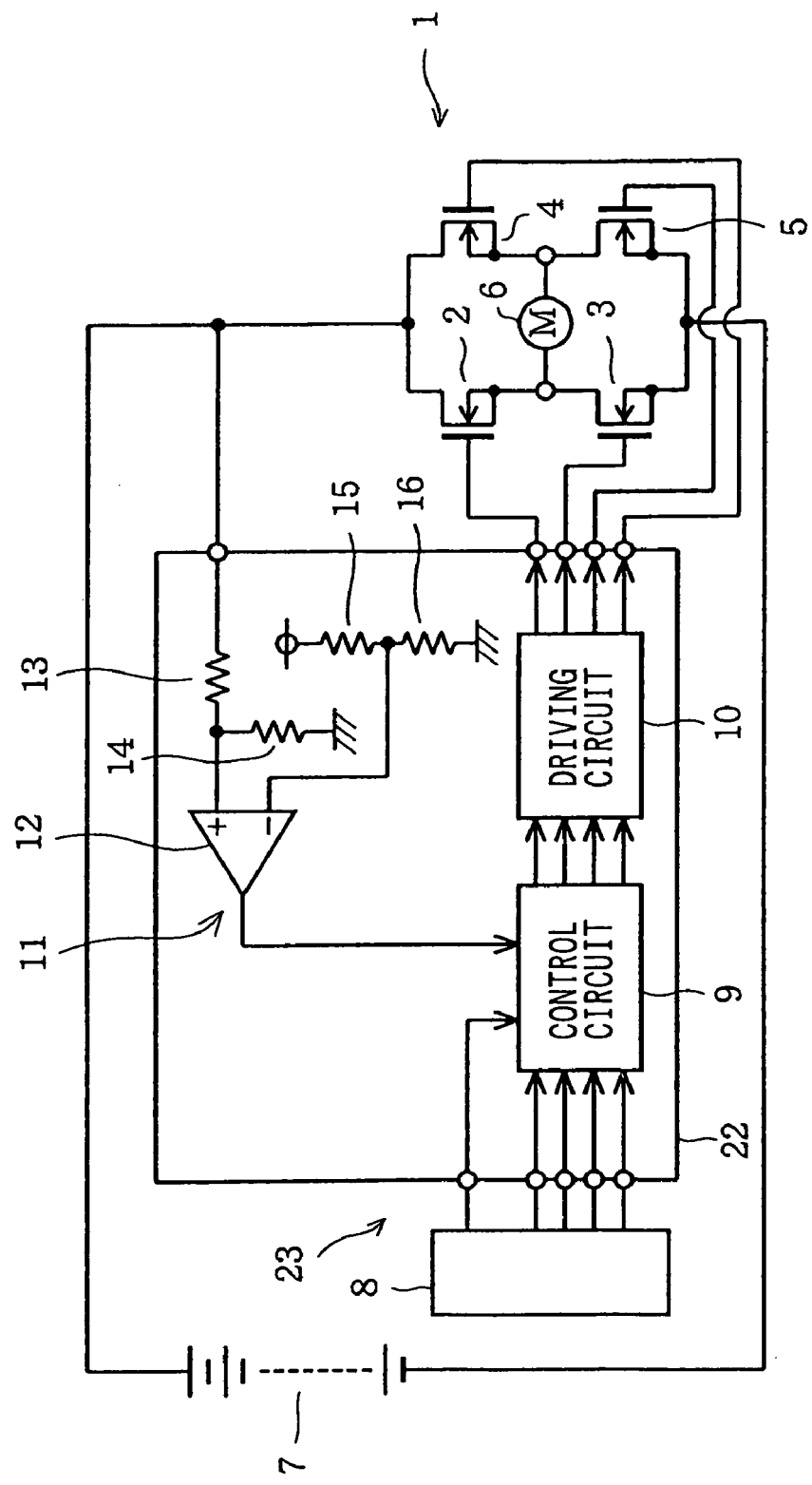
FIG. 1 is a diagram showing a configuration including an H bridge circuit and a driving apparatus for driving the H bridge circuit applied to an actuator ECU mounted on a vehicle in accordance with a first embodiment.

Referring to FIGS. 1 to 5, a first embodiment implementing of an actuator ECU mounted on a vehicle as, for example, an ECU for driving a DC motor for opening and closing a throttle valve of the engine will be described. FIG. 1 is a diagram showing a configuration including an H bridge circuit 1 and a driving apparatus for driving the H bridge circuit 1. As shown in the figure, the H bridge circuit 1 comprises four N-channel power MOSFETs 2 to 5 wired to each other in a bridge connection. The N-channel power MOSFETs 2 to 5 are each used as a semiconductor switching-device. A DC motor 6 is connected to the H bridge circuit 1 as the load of the H bridge circuit 1. The DC motor 6 outputs a rotation power for opening and closing the throttle valve of the engine. The mechanism for applying the rotation power is not shown in the figures for ease of illustration. As a power supply for supplying power to the H bridge circuit 1, a battery 7 of the vehicle is employed. The battery 7 outputs a typical voltage of 14V.

A microcomputer 8 is a component for driving and controlling the H bridge circuit 1. Typically, on the basis of a command received from a control apparatus at an upper level by way of, for example, a LAN in the vehicle, the microcomputer 8 outputs a control signal for switching between FETs 2, 5 and FETs 3, 4 by way of a control circuit 9 and a driving circuit 10. When the microcomputer 8 detects an event such as an interrupt requiring that the DC motor 6 be stopped urgently, the microcomputer 8 outputs a termination signal directly to the control circuit 9. In a normal operation, the control circuit 9 passes on a gate control signal received from the microcomputer 8 to the driving circuit 10 as a driving signal. When an over-voltage detection circuit 11 or the like detects an abnormality or the microcomputer 8 outputs an urgent-termination signal as described above, however, the control circuit 9 does not pass on the gate control signal to the driving circuit 10.

The driving circuit 10 outputs a gate signal to the gate of each of the FETs 2 to 5 for driving each of the FETs 2 to 5 in accordance with the gate control signal generated by the microcomputer 8. It is to be noted that a voltage raised by a charge-pump circuit not shown in the figure is applied to the FETs 2 and 4 on the side of the power supply to drive the FETs 2 and 4.

The over-voltage detection circuit 11 includes a comparator 12. The non-inverting input terminal of the comparator 12 is connected to a voltage-division point between resistors 13 and 14 for dividing a voltage appearing on the power-supply side of the H bridge circuit 1, that is, a voltage appearing at the positive-side terminal of the battery 7. On the other hand, the inverting input terminal of the comparator 12 is connected to a voltage-division point between resistors 15 and 16 for dividing a power-supply voltage of the comparator 12. Typically, the power-supply voltage of the comparator 12 is 5V.

Assume for example that the voltage-division ratio of the resistors 15 and 16 is 1:1 whereas the voltage-division ratio of the resistors 13 and 14 is 7:1. In this case, when the voltage appearing on the power-supply side of the H bridge circuit 1 exceeds 20V, the comparator 12 outputs a detection signal set at a high level.

Figure 2:
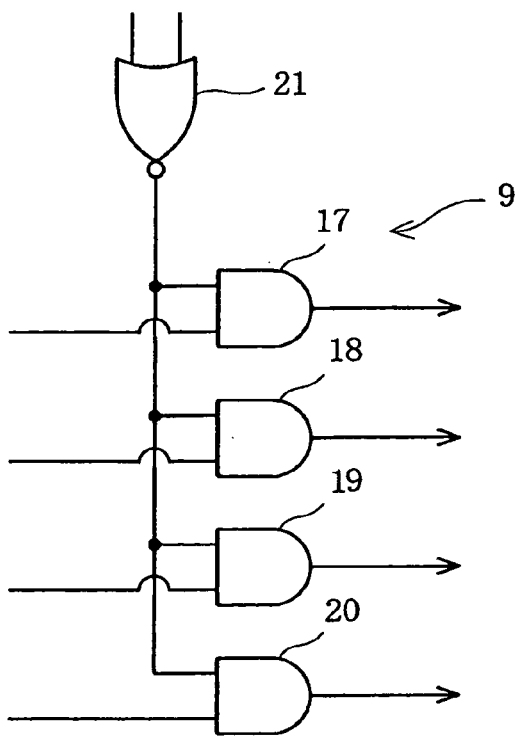
FIG. 2 is a diagram showing a typical concrete configuration of a control circuit employed in the driving apparatus.

FIG. 2 is a diagram showing a typical concrete configuration of the control circuit 9. As shown in the figure, the control circuit 9 comprises four AND gates 17 to 20 and a NOR gate 21. The AND gates 17 to 20 are each associated with one of the FETs 2 to 5. A gate control signal output by the microcomputer 8 to one of the FETs 2 to 5 is supplied to one of the input terminals pertaining to one of the four AND gates 17 to 20, which is associated with the target FET receiving the gate control signal. The other input terminal pertaining to each of the four AND gates 17 to 20 is connected to the output terminal of the NOR gate 21. An urgent-termination signal output by the microcomputer 8 and a detection signal output by the over-voltage detection circuit 11 are supplied to the input terminals of the NOR gate 21.

It is to be noted that other signals can also be supplied to input terminals of the NOR gate 21. An example of the other signals is a signal detecting a cause of the need to urgently stop the DC motor 6. The control circuit 9, the driving circuit 10 and the over-voltage detection circuit 11, which are described above, form the driving apparatus 22. The driving apparatus 22 and the microcomputer 8 compose the actuator ECU 23.

Next, the operation of the embodiment is explained by referring to FIGS. 3A to 5. In a normal operating state, the microcomputer 8 rotates the DC motor 6 in the normal direction to open the throttle valve of the engine. In this case, typically, the FETs 2 and 5 are put in an electrically conductive state while the FETs 4 and 3 are put in an electrically non-conductive state to flow a current through a winding of the DC motor 6 in the normal-rotation direction. When the microcomputer 8 rotates the DC motor 6 in the reverse direction to close the throttle valve of the engine, on the other hand, the FETs 2 and 5 are put in an electrically non-conductive state while the FETs 4 and 3 are put in an electrically conductive state to flow a current through the winding of the DC motor 6 in the reverse-rotation direction.

Figure 3A:
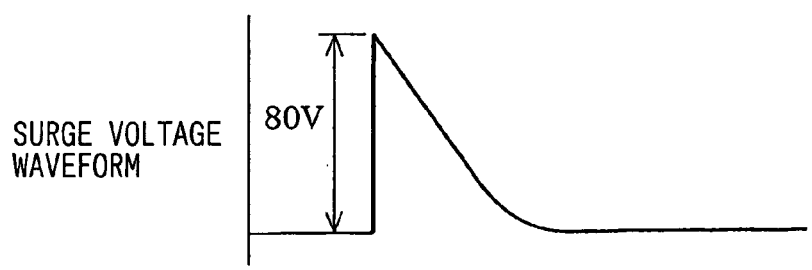
FIG. 3A is a diagram showing the waveform of a surge voltage of 80V applied to a power-supply side of the H bridge circuit.
Figure 3B:
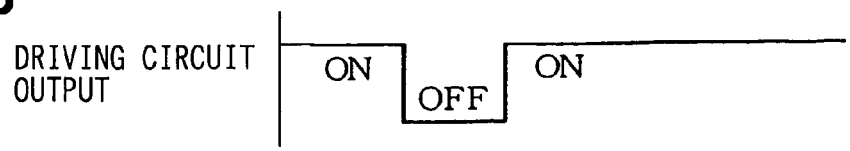
FIG. 3B is a diagram showing the waveform of a gate signal output by a driving circuit for driving the H bridge circuit employed in the driving apparatus.

FIGS. 3A–3B are diagrams showing a state in which the microcomputer 8 rotates the DC motor 6 in the normal or reverse direction. As described above, in the normal or reverse direction, only two of the FETs 2 to 5 of the H bridge circuit 1 are put in an electrically conductive state. When a surge voltage of 80 V is applied to the power-supply side of the H bridge circuit 1 as shown in FIG. 3A, the driving circuit 10 outputs a gate signal as shown in FIG. 3B.

When a surge voltage exceeding 20V is applied, the over-voltage detection circuit 11 outputs a detection signal to set signals output by all the AND gates 17 to 20 employed in the control circuit 9 at a low level. Thus, the FETs 2 to 5 of the H bridge circuit 1 are all put in a cut-off state or turned off. As the surge voltage decreases to a level below lower than 20V, the over-voltage detection circuit 11 no longer outputs the detection signal. Thus, the output gate signal is restored to the state preceding the application of the surge voltage.

Figure 4:
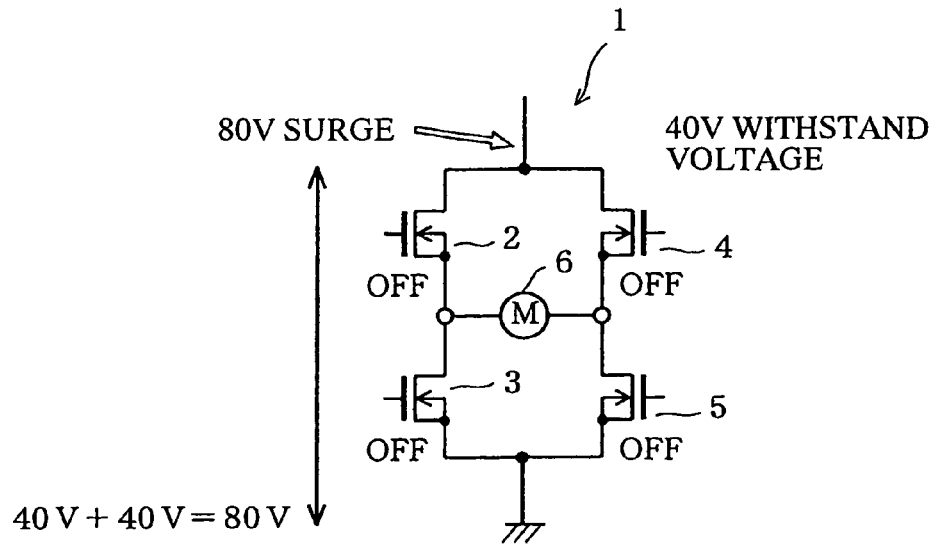
FIG. 4 is a diagram showing a state of the H bridge circuit to which a surge voltage of 80V is applied.
Figure 5:
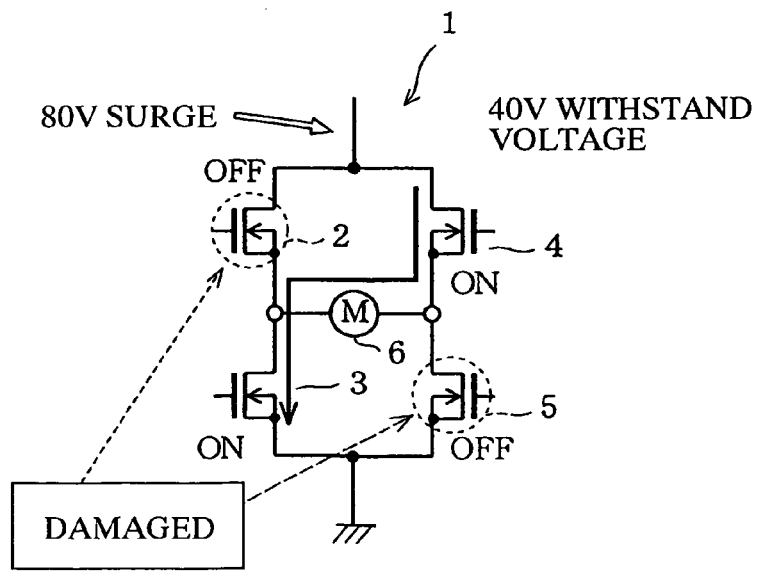
FIG. 5 is a diagram showing the same state shown in FIG. 4 except that the state shown in FIG. 5 is obtained without the control circuit.

FIG. 4 is an explanatory diagram referred to in describing the state of the H bridge circuit 1 as a state prevailing as a result of applying a surge voltage of 80V. FIG. 5 is an explanatory diagram showing a state similar to that shown in FIG. 4 except that, in the case of FIG. 5, the control circuit 9 of the embodiment is eliminated. Assume for example that the withstand voltage of the FETs 2 to 5 is 40V. In this case, when a surge voltage of 80V is applied with the FETs 4 and 3 put in an electrically conductive state as shown in FIG. 5, the surge voltage of 80V is applied to the FETs 2 and 5, which are put in an electrically non-conductive state, damaging the FETs 2 and 5 since the surge voltage is an over-voltage that the FETs 2 and 5 are not capable of enduring.

In the case of the embodiment shown in FIG. 4, on the other hand, the FETs 2 to 5 are all put in an electrically non-conductive state in the event of a surge voltage. Thus, the FET 2 on the side of the power supply and the FET 3 on the side of the ground share the surge voltage of 80V, each bearing a voltage of only 40V. By the same token, the FET 4 on the side of the power supply and the FET 5 on the side of the ground share the surge voltage of 80V, each bearing a voltage of only 40V. As a result, even if a surge voltage twice the withstand voltage of FETs 2 to 5 is applied, the FETs 2 to 5 are each capable of enduring a portion of the surge voltage.

As described above, in accordance with the embodiment, when the over-voltage detection circuit 11 detects an over-voltage being applied to the H bridge circuit 1, the control circuit 9 outputs a gate-driving signal to the driving circuit 10 to put all the FETs 2 to 5 employed in the H bridge circuit 1 in an electrically non-conductive state. In the electrically non-conductive state, the FETs 2 to 5 each need to bear only ½ the over-voltage. Thus, the FETs 2 to 5 can be protected without employing a special protection circuit. In addition, the protection mechanism can be made compact and built at a low cost. Furthermore, since the withstand voltage of the FETs 2 to 5 does not have to be raised to keep up with an increasing over-voltage, the on resistance of the FETs 2 to 5 does not increase so that the amount of heat dissipated in the normal operation of the H bridge circuit 1 can be suppressed to a small value.

Moreover, since the control circuit 9 is implemented by hardware or, to put it concretely, since the control circuit 9 is implemented as a logic circuit comprising the AND gates 17 to 20 and the NOR gate 21, the FETs 2 to 5 can be protected very quickly in the event of a detected over-voltage. Further, since the H bridge circuit 1 is applied to an apparatus for driving the DC motor 6 mounted on a vehicle, the FETs 2 to 5 can be prevented from being damaged even in an environment prone to a surge voltage, which is generated relatively with ease in the power-supply system of the battery 7.

Second to Sixth Embodiments

FIGS. 6 to 10 are diagrams showing second to sixth embodiments respectively. Only differences from the first embodiment are explained. These embodiments are different from each other in that they employ different types of semiconductor switching-devices in the H bridge circuit.

Figure 6:
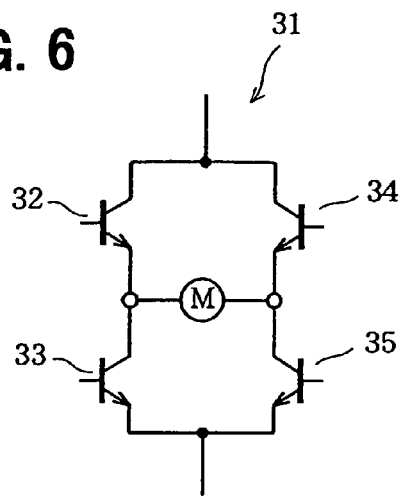
FIG. 6 is a diagram showing the configuration of an H bridge circuit implemented according to a second embodiment.
Figure 7:
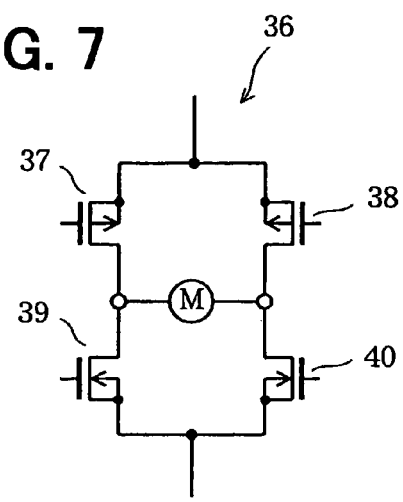
FIG. 7 is a diagram, which shows the configuration of an H bridge circuit implemented according to a third embodiment.

In the second embodiment shown in FIG. 6, the H bridge circuit 31 employs four NPN transistors 32 to 35. In the third embodiment shown in FIG. 7, the H bridge circuit 36 employs P-channel MOSFETs 37 and 38 on the side of the power supply as well as N-channel MOSFETs 39 and 40 on the side of the ground.

Figure 8:
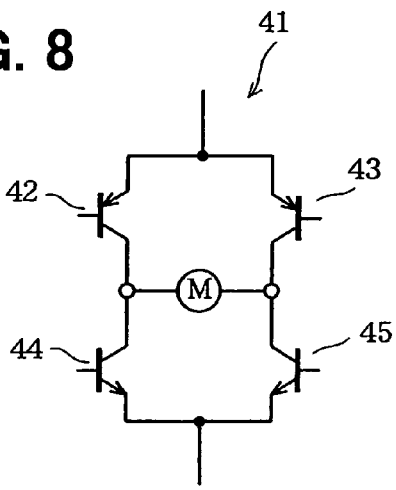
FIG. 8 is a diagram, which shows the configuration of an H bridge circuit implemented according to a fourth embodiment.
Figure 9:
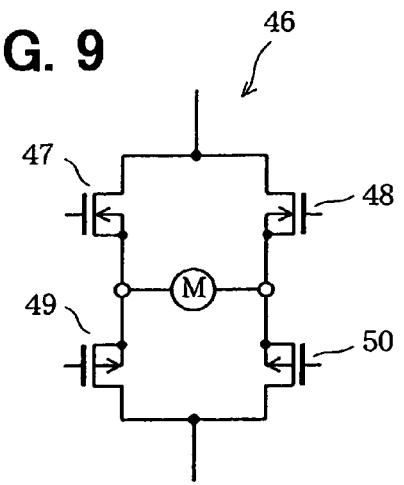
FIG. 9 is a diagram, which shows the configuration of an H bridge circuit implemented according to a fifth embodiment.
Figure 10:
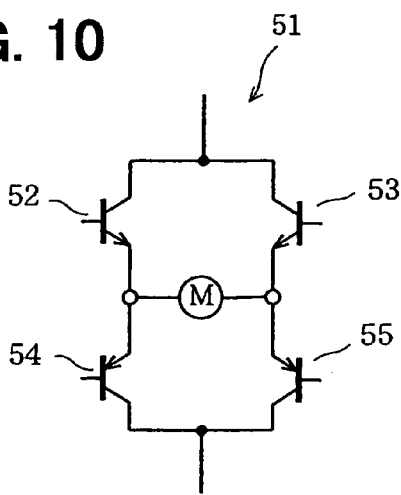
FIG. 10 is a diagram, which shows the configuration of an H bridge circuit implemented according to a sixth embodiment.

In the fourth embodiment shown in FIG. 8, the H bridge circuit 41 employs two PNP transistors 42 and 43 on the side of the power supply as well as two NPN transistors 44 and 45 on the side of the ground. In the fifth embodiment shown in FIG. 9, the H bridge circuit 46 employs N-channel MOSFETs 47 and 48 on the side of the power supply as well as P-channel MOSFETs 49 and 50 on the side of the ground. In the sixth embodiment shown in FIG. 10, the H bridge circuit 51 employs two NPN transistors 52 and 53 on the side of the power supply as well as two PNP transistors 54 and 55 on the side of the ground.

The second to sixth embodiments described above also have the same effects as the first embodiment.

Seventh Embodiment

Figure 11:
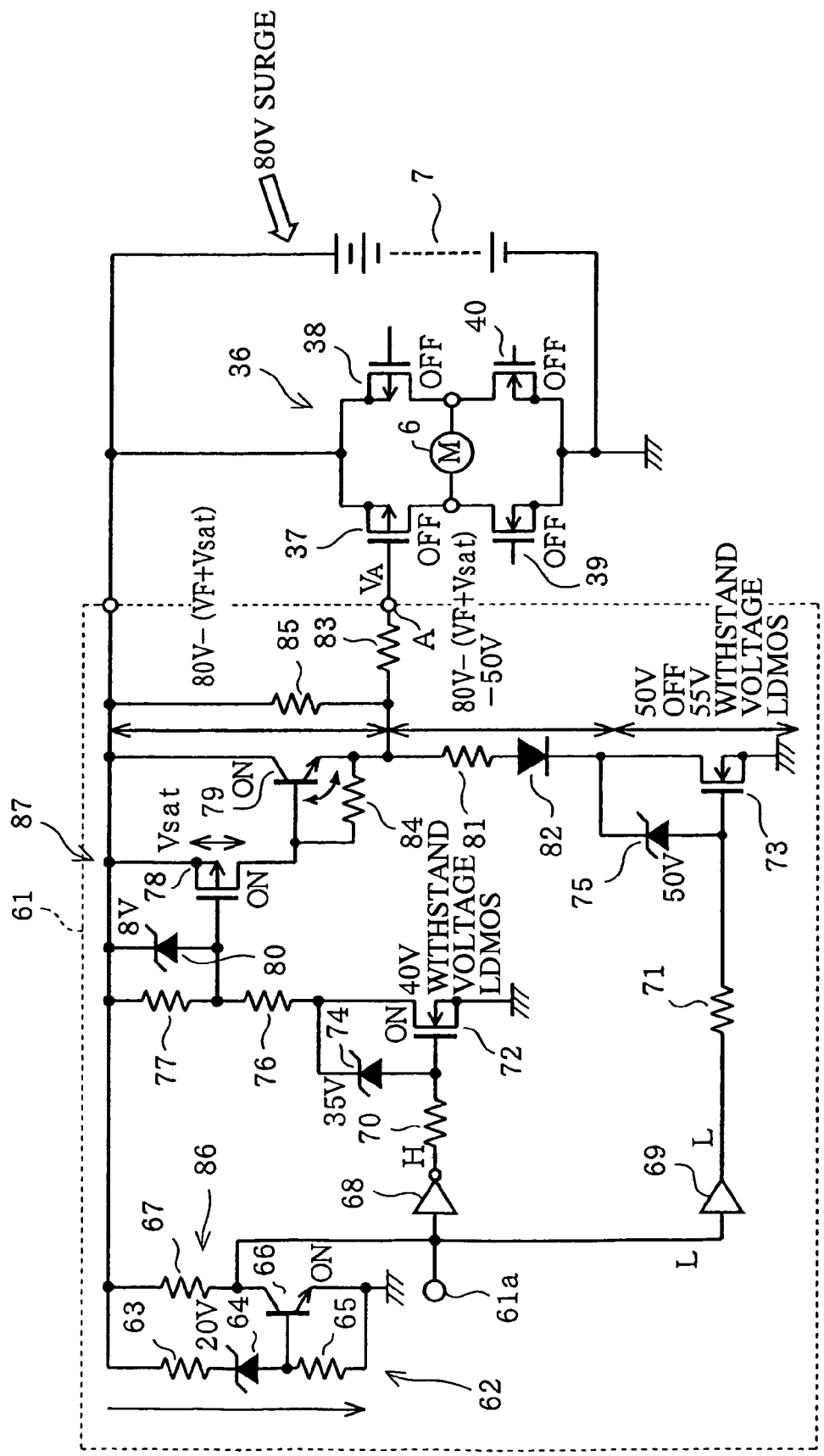
FIG. 11 is a diagram showing a detailed configuration of a driving circuit implemented according to a seventh embodiment.
Figure 12:
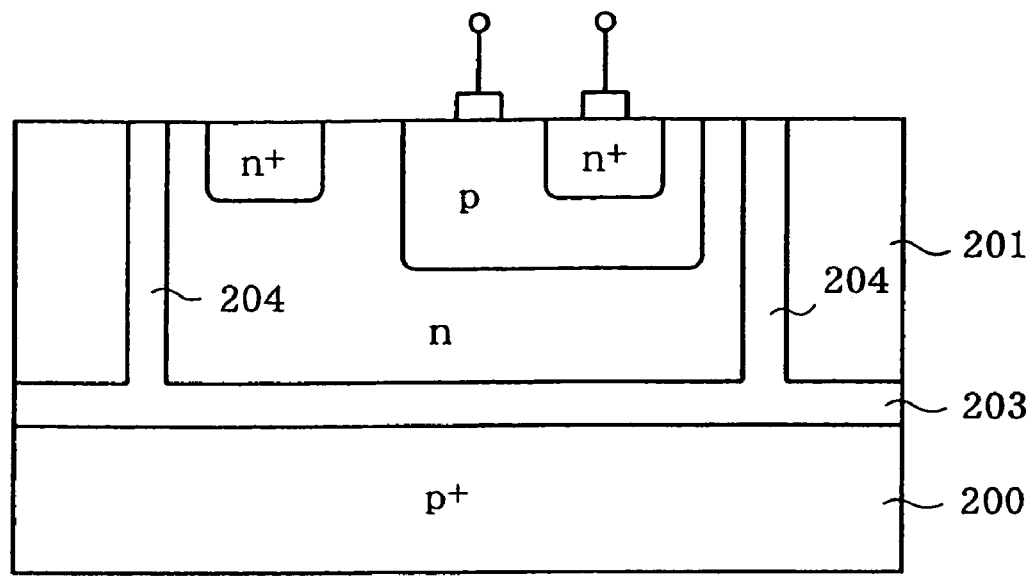
FIG. 12 is a cross-sectional diagram showing a model of a semiconductor configuration employed in the driving circuit.

FIGS. 11 to 13 are diagrams showing a seventh embodiment of the present invention. The seventh embodiment includes the H bridge circuit 36 of the third embodiment shown in FIG. 7 and a concrete configuration of a driving apparatus 61. As described above, the H bridge circuit 36 employs the P-channel MOSFETs 37 and 38 on the side of the power supply. In such a configuration, a charge-pump circuit for a configuration including N-channel MOSFETs on the side of the power supply is not required. Thus, the seventh embodiment has a merit of a simple configuration of the driving circuit. However, in order to put these FETs 37 and 38 in an electrically non-conductive state in case a surge voltage is applied, a voltage having a level close to the surge voltage needs to be supplied to the gates of the FETs 37 and 38. For this reason, the driving apparatus 61 itself must be capable of enduring an applied high voltage and have a circuit configuration capable of putting the FETs 37 and 38 in an electrically non-conductive state with a high degree of reliability.

The driving apparatus 61 includes an over-voltage detection circuit 62, which is a series circuit comprising a resistor 63, a Zener diode 64 and a resistor 65. The Zener voltage of the Zener diode 64 is typically about 20V, which is approximately the same as the detection level of a surge voltage. The common connection point between the Zener diode 64 and the resistor 65 is wired to the base of an NPN transistor 66. The collector of the NPN transistor 66 is connected to the power supply through a resistor 67 and the emitter of the NPN transistor 66 is connected to the ground. The collector of the NPN transistor 66 is also connected to a signal input terminal 61a for receiving a control signal from the over-voltage detection circuit 11.

The signal input terminal 61a is connected to the input terminals of a NOT gate 68 and a buffer 69. The output terminal of the NOT gate 68 is connected to the gate of an N-channel MOSFET 72 serving as a first semiconductor switching-device through a resistor 70 whereas the output terminal of the buffer 69 is connected to the gate of an N-channel MOSFET 73 serving as a driving device on the side of the ground through a resistor 71. The N-channel MOSFET 72 is an LD (Laterally Diffused) MOSFET with a withstand voltage of 40V whereas the N-channel MOSFET 73 is an LD MOSFET with a withstand voltage of 55V. The sources of the FETs 72 and 73 are connected to the ground. A Zener diode 74 is connected between the drain and gate of the N-channel MOSFET 72 whereas a Zener diode 75 is connected between the drain and gate of the N-channel MOSFET 73. It is to be noted that the Zener voltages of the Zener diodes 74 and 75 are typically 35V and 50V respectively.

In addition, as shown in FIG. 12, these devices each have a configuration of the form comprising a trench separation structure added to an SOI (Silicon On Insulator) structure so as to assure a high insulation withstand voltage as is disclosed in a document such as Japanese Patent No. 3,255,147 and corresponding U.S. Pat. No. 6,385,028, the contents of both of which are incorporated herein by reference. It is to be noted that FIG. 12 is a diagram showing the configuration of an NPN transistor. In this configuration, a p+ silicon substrate 200 is joined to an n-type silicon substrate 201 by mutual pasting through a silicon oxide film (or an embedded oxide film) 203 to form an SOI structure. In addition, in the n-type silicon substrate 201, trench oxide films 204 each extended from the surface of the n-type silicon substrate 201 to a trench oxide film 204 are formed. A silicon area enclosed by the trench oxide films 204 and the silicon oxide film (or an embedded oxide film) 203 forms an island, that is, a device formation area.

The drain of the N-channel MOSFET 72 is connected to the power supply through resistors 76 and 77 whereas the source of the N-channel MOSFET 72 is connected to the ground. The common connection point between the resistors 76 and 77 is connected to the gate of a P-channel MOSFET 78, which is used as a second semiconductor switching-device. The source of the P-channel MOSFET 78 is connected to the power supply and the drain of the P-channel MOSFET 78 is connected to the base of an NPN transistor 79, which is used as a driving device on the side of the power supply. In addition, a Zener diode 80 having a typical Zener voltage of 8V is also connected between the source and gate of the P-channel MOSFET 78.

The collector of the NPN transistor 79 is connected to the power supply whereas its emitter is connected to the drain of the N-channel MOSFET 73 through a resistor 81 and a Zener diode 82. The emitter of the NPN transistor 79 is also connected to the gate of the P-channel MOSFET 37 through a resistor 83. A resistor 84 is connected between the base and emitter of the NPN transistor 79. A resistor 85 is connected between the collector and emitter of the NPN transistor 79 in parallel to the NPN transistor 79. The Zener diode 82 is a component for blocking a reverse current flowing to the side of the power supply.

It is to be noted that the same configuration as what is described above is also prepared for the P-channel MOSFET 38. As for the N-channel MOSFETs 39 and 40, a special configuration, which is used for putting them in an electrically non-conductive state in case a surge current is detected, is not required and is therefore not shown in the figure. In the configuration described above, the NPN transistor 66 and the resistor 67 form a control circuit 86. The driving apparatus 61 excluding the over-voltage detection circuit 62 and the control circuit 86 is a driving circuit 87.

Next, the operation of the seventh embodiment is explained. In a normal operation with no surge voltage detected, the microcomputer 8 supplies a control signal to the signal input terminal 61a of the driving apparatus 61. In the over-voltage detection circuit 62, when the voltage of the power supply is at about the normal level of 14V, the Zener diode 64 is not electrically conductive, putting the NPN transistor 66 in an electrically non-conductive state.

When the signal input terminal 61a is put at a low (L) level, the N-channel MOSFET 72 is put in an electrically conductive state while the N-channel MOSFET 73 is put in an electrically non-conductive state. In these states, the P-channel MOSFET 78 is put in an electrically conductive state, allowing a current to flow to the base of the NPN transistor 79. Thus, the NPN transistor 79 is put in an electrically conductive state. At that time, an electrical potential $V_A$ appearing at a point A wired to the gate of the P-channel MOSFET 37 is expressed by the following equation:

$$V_A = VCC - (Vsat + VF)$$

where notation Vcc denotes the voltage of the power supply, notation Vsat denotes a voltage appearing between the source and drain of the P-channel MOSFET 78 and notation VF denotes a voltage BE appearing between the base and emitter of the NPN transistor 79. By setting (Vsat+VF) at about 0.8V and setting the threshold voltage of the P-channel MOSFET 37 at a value in the range 1.5V to 3.0V, the P-channel MOSFET 37 is put in an electrically non-conductive state.

When the signal input terminal 61a is put at a high (H) level, on the other hand, the electrically conductive states and the electrically non-conductive states described above are reversed. That is, the NPN transistor 79 is put in an electrically non-conductive state while the N-channel MOSFET 73 is put in an electrically conductive state. Thus, a voltage $V_A$ obtained as a result of voltage division by the resistors 85 and 81 as well as the Zener diode 82 biased in the forward direction appears at the point A, putting the FET 37 in an electrically conductive state.

Much like the first embodiment, assume for example that a surge voltage of about 80V is applied to the power supply due to a load dump or the like. At that time, when the signal input terminal 61a is set at a high level and the FET 72 as well as the FET 78 are in an electrically non-conductive state, a surge current flows through the Zener diode 80, a resistor 76 and the Zener diode 74. Thus, the FETs 78 and 72 are protected by clamp operations of the Zener diodes 80 and 74.

In addition, at that time, in the over-voltage detection circuit 62, an electric potential appearing at the anode of the Zener diode 64 exceeds 20V, turning on the Zener diode 64. Thus, the NPN transistor 66 is put in an electrically conductive state, pulling down the signal input terminal 61a to a low level. As a result, the electric potential $V_A$ appearing at the point A satisfies the equation $V_A = 80V - (Vsat + VF)$, putting the P-channel MOSFET 37 in an electrically non-conductive state. Then, since a surge current flows through the resistor 81, the Zener diode 82 and the Zener diode 75, the N-channel MOSFET 73 put in an electrically non-conductive state is protected by a clamp operation of the Zener diode 75.

FIG. 11 shows a configuration for electric-potential relations centering at the point A. Since the terminal voltage of the N-channel MOSFET 73 is 50V and the electric potential $V_A$ appearing at the point A is $V_A = 80V - (Vsat + VF) = 79.2V$, the resistor 81 and the Zener diode 82 bear a difference of 29.2V (=79.2V−50V) between the terminal voltage of the N-channel MOSFET 73 and the electric potential VA appearing at the point A.

Figure 13A:
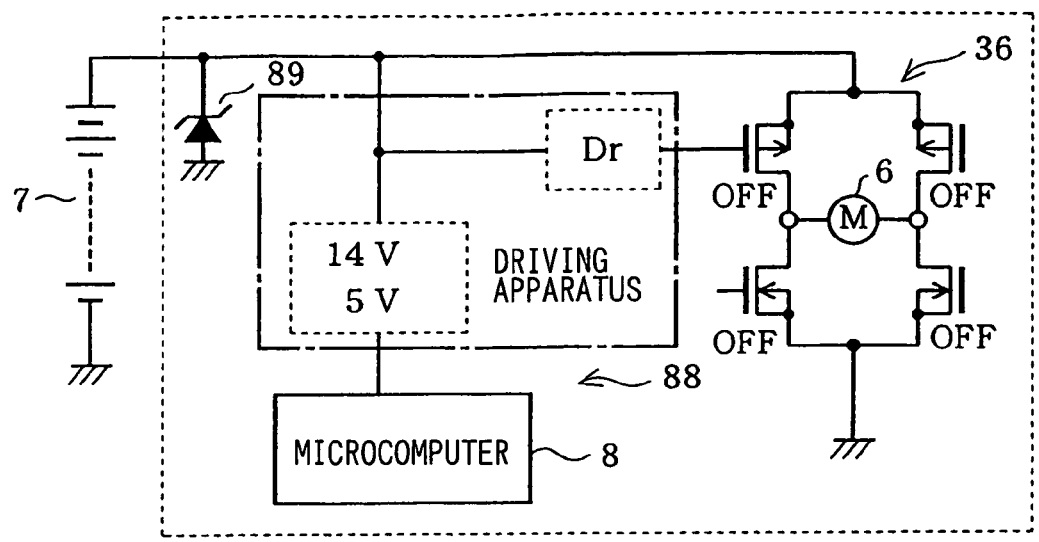
FIG. 13A is a diagram showing a configuration in which a Zener diode for absorbing a surge voltage is directly connected to a power supply as a diode outside a motor-driving ECU.
Figure 13B:
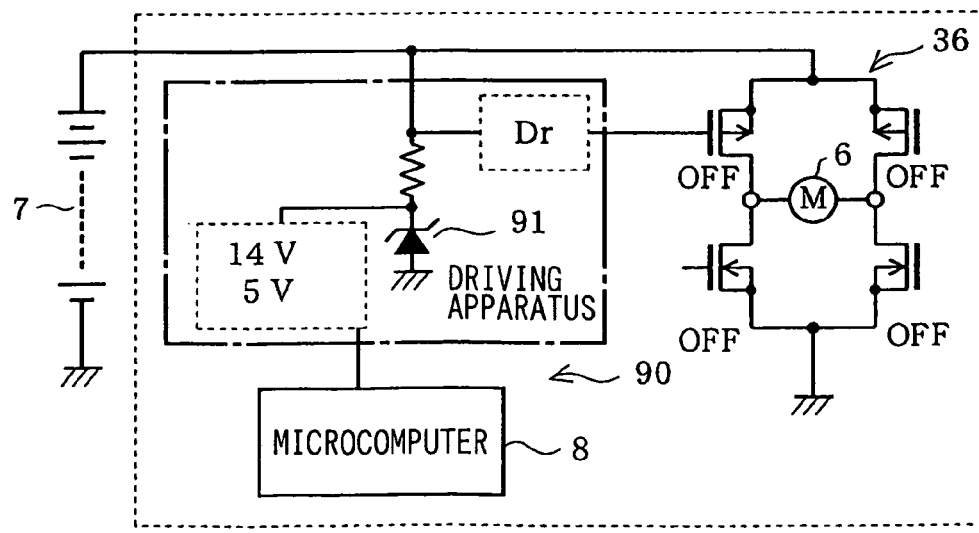
FIG. 13B is a diagram showing a configuration in which the Zener diode for absorbing a surge voltage is provided inside the motor-driving ECU.

Referring to FIGS. 13A–13B, the circuit configuration will be partially explained. FIG. 13A is a diagram showing a configuration in which a Zener diode 89 for absorbing a surge voltage is directly connected to the power supply outside a motor-driving ECU 88. In this configuration, since the Zener diode 89 mounted on a print wiring board has a large current capacity and a large size, the surge voltage can be absorbed effectively.

On the other hand, FIG. 13B is a diagram showing a configuration intended for the purpose of integrating a motor-driving ECU 90, the motor 6 and the H bridge circuit 36. In this configuration, the motor-driving ECU 90 is built in an IC chip having an extremely small size and subjected to a transfer-molding process. In this case, since the Zener diode 89 having a large size cannot be installed externally to the motor-driving ECU 90, a Zener diode 91 having a small size is installed in the IC chip. As a result, the Zener diode 91 can be used as a device for protecting circuits such as a driving circuit Dr and a power-supply circuit, which are embedded in the IC chip, against an over-voltage. However, since the Zener diode 91 is not capable of protecting the H bridge circuit 36, a configuration like the one provided by the present embodiment is required.

As described above, in accordance with the seventh embodiment, with the P-channel MOSFETS 37 and 38 each employed as a semiconductor switching-device on the power-supply side of the H bridge circuit 36, when an over-voltage having a level exceeding the Zener voltage of the Zener diode 64 employed in the over-voltage detection circuit 62 is applied, a signal appearing at the signal input terminal 61a of the driving circuit 87 is set at the same level as the case in which the P-channel MOSFET 37 is put in an electrically non-conductive state. Thus, the FETs 72 and 78 are each put in an electrically conductive state and the NPN transistor 79 also electrically conducts. As a result, the electric potential appearing at the gate of the P-channel MOSFET 37 is set at a level obtained as a result of subtracting the voltage Vsat and the voltage VBE from the over-voltage applied to the power supply, where the voltage Vsat is a voltage appearing between the source and drain of the P-channel MOSFET 78 and the voltage VBE is a voltage appearing between the base and emitter of the NPN transistor 79. With the electric potential of the gate of the P-channel MOSFET 37 set at such a level, the P-channel MOSFET 37 is put in an electrically non-conductive state with a high degree of reliability.

In addition, when an over-voltage is detected, a voltage is applied to the output terminal of the NOT gate 68 for driving the N-channel MOSFET 72. The voltage is applied to the output terminal of the NOT gate 68 at a level obtained as a result of subtracting voltage drops through the Zener diodes 80 and 74 as well as the resistor 76 from the over-voltage. Thus, the voltage applied to the output terminal of the NOT gate 68 is lower than the over-voltage. In addition, the clamp operations of the Zener diodes 80 and 74 protect the FETs 72 and 78 against the over-voltage.

In addition, even if the over-voltage is detected and the N-channel MOSFET 73 is put in an electrically non-conductive state, the Zener diode 75 electrically conducts provided that a voltage applied to the drain of the N-channel MOSFET 73 exceeds the Zener voltage of the Zener diode 75. Thus, the N-channel MOSFET 73 can be protected with a high degree of reliability in that a voltage exceeding the withstand voltage of the N-channel MOSFET 73 is never applied to the N-channel MOSFET 73. In addition, when the Zener diode 75 electrically conducts, a current flows through the resistor 81, generating a voltage drop between the terminals of the resistor 81. Thus, since a voltage drops from the over-voltage, the N-channel MOSFET 73 and the Zener diode 75 can be relieved from the over-voltage by the voltage drop. As a result, the withstand voltage of the N-channel MOSFET 73 or the Zener voltage of the Zener diode 75 can be set to a lower value.

In addition, at least, the devices composing the driving circuit 87 each preferably have a configuration comprising a trench separation structure added to an SOI structure so as to assure a high insulation withstand voltage in comparison with a junction separation structure. Thus, the driving circuit 87 can be created in an easy way. That is, in the case of the junction separation structure, a voltage of about 80V relative to the 0V electric potential of the substrate is applied to the NPN transistor 79 and the resistor 81, which are included in the configuration shown in FIG. 11. The NPN transistor 79 and the resistor 81 may possibly become damaged because the applied voltage is much higher than the withstand voltages of the NPN transistor 79 and the resistor 81. However, in the case of the SOI structure, on the other hand, the withstand voltage of the oxide film 203 is several times higher. Thus, even if the electric potential of the substrate 200 is 0V, no devices are damaged.

Eighth Embodiment

Figure 14:
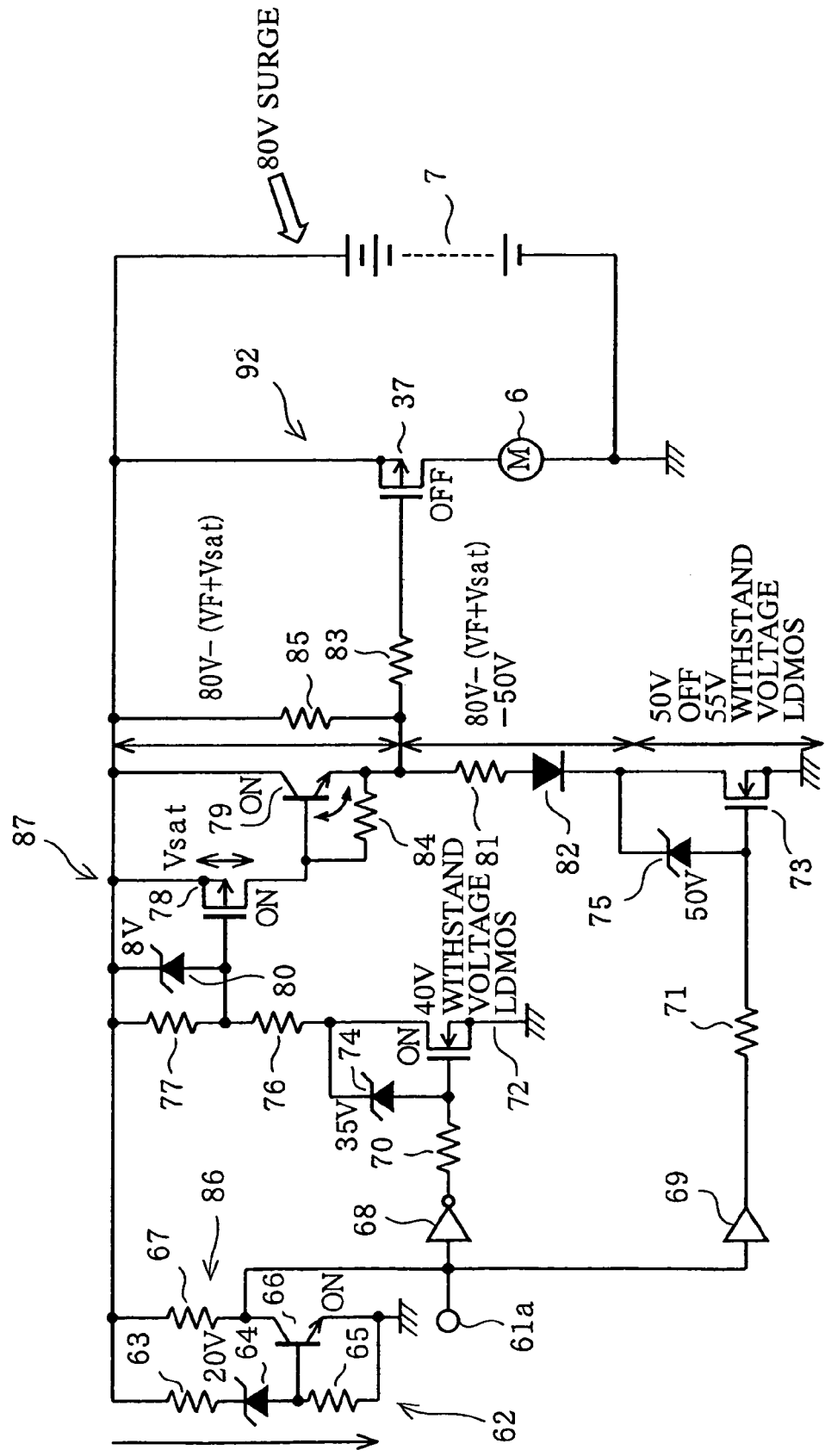
FIG. 14 is a diagram showing an eighth embodiment implementing a motor-driving circuit adopting a high-side driving-method and a driving circuit for driving the motor-driving circuit.

FIG. 14 is a diagram showing an eighth embodiment. Only differences from the seventh embodiment are explained. The eighth embodiment is obtained by modifying the configuration of the driving apparatus 61 employed in the seventh embodiment. That is, in place of the H bridge circuit 36, one FET 37 is employed in a motor-driving circuit 92 of the according to the high-side driving-method. The motor-driving circuit 92 is provided between the battery 7 and the motor 6. The operation of the driving circuit 87 in this eighth embodiment is entirely the same as the seventh embodiment.

Ninth Embodiment

Figure 15:
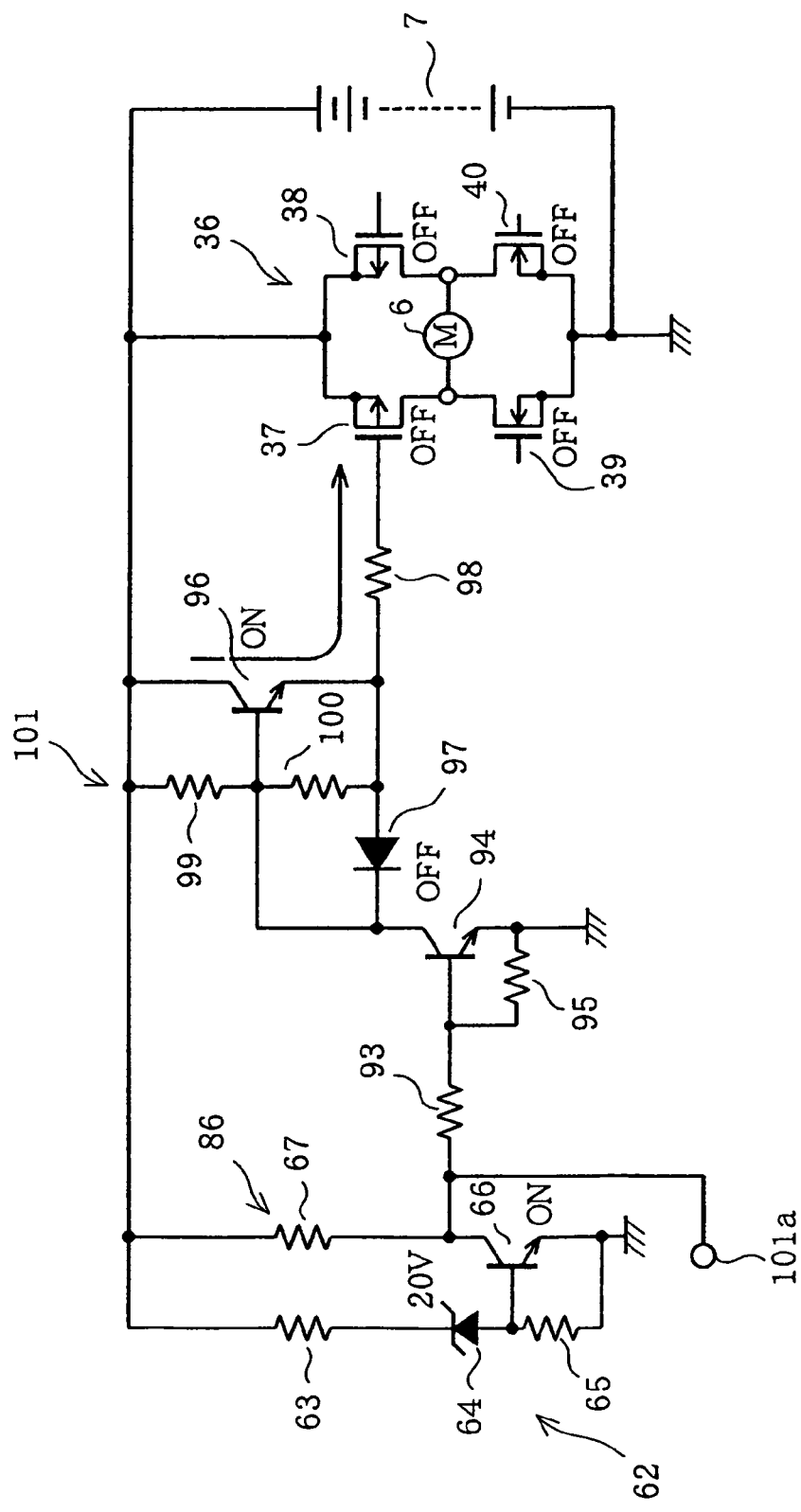
FIG. 15 is a diagram of a driving circuit implemented according to a ninth embodiment.

FIG. 15 is a diagram showing a ninth embodiment. The configuration of the ninth embodiment is simple in comparison with the configuration of the driving circuit 87 implemented by the seventh and eighth embodiments. The configurations of the over-voltage detection circuit 62 and the control circuit 86 remain unchanged, but the collector of the NPN transistor 66 is connected to the base of an NPN transistor 94 serving as a driving device on the side of the ground through a resistor 93. A resistor 95 is connected between the base and emitter of the NPN transistor 94.

The emitter of the NPN transistor 94 is connected to the ground and its collector is connected to the base of an NPN transistor 96 serving as a driving device on the side of the power supply. The collector of the NPN transistor 94 is also connected to the gate of the P-channel MOSFET 37 through a diode 97 provided in its reverse direction and a resistor 98. The collector of the NPN transistor 96 is connected to the power supply, that is, the positive-side terminal of the battery 7. The emitter of the NPN transistor 96 is connected to the anode of the diode 97. A resistor 99 is connected between the base and collector of the NPN transistor 96 whereas a resistor 100 is connected between the base and emitter of the NPN transistor 96. The components described above form a driving circuit 101.

Next, the operation of the ninth embodiment is explained. When a signal input terminal 101a is set at a high level, the NPN transistor 94 is put in an electrically conductive state but the NPN transistor 96 is put in an electrically non-conductive state so that an electric potential appearing at the gate of the P-channel MOSFET 37 approaches the level of the ground, putting the P-channel MOSFET 37 in an electrically conductive state. When a signal input terminal 101a is set at a low level, on the other hand, the NPN transistor 94 is put in an electrically non-conductive state but the NPN transistor 96 is put in an electrically conductive state so that the electric potential appearing at the gate of the P-channel MOSFET 37 approaches the level of the power supply, putting the P-channel MOSFET 37 in an electrically non-conductive state.

When the over-voltage detection circuit 62 detects an over-voltage, the NPN transistor 66 is put in an electrically conductive state much like the seventh embodiment. With the NPN transistor 66 put in an electrically conductive state, the signal input terminal 101a is pulled down to the low level, putting the P-channel MOSFET 37 in an electrically non-conductive state as described above. At that time, the over-voltage that can be coped with corresponds to the withstand voltage of the NPN transistor 94.

In this driving circuit 101, when an over-voltage is detected, a current flowing through the NPN transistor 96 electrically charges a gate capacitor of the P-channel MOSFET 37. Thus, the electric potential appearing at the gate of the P-channel MOSFET 37 can be increased to a level close to the over-voltage before the NPN transistor 96 is put in an electrically non-conductive state. As a result, no current is consumed wastefully. When the P-channel MOSFET 37 is put in an electrically conductive state in a normal operation, a current flows through the resistors 99 and 100 as well as the NPN transistor 94. By increasing the resistances of the resistors 99 and 100, however, the magnitude of the consumed power can be suppressed.

As described above, in accordance with the ninth embodiment, the NPN transistor 96 employed in the driving circuit 101 is put in an electrically conductive state when the over-voltage detection circuit 62 detects an over-voltage. Thus, the electric potential appearing at the gate of the P-channel MOSFET 37 can be lowered from the over-voltage applied to the power supply by a voltage drop VCE generated by the electrically conductive state of the NPN transistor 96. Since the electric potential appearing at the gate of the P-channel MOSFET 37 is set at a cut-off level established in this way, the P-channel MOSFET 37 is put in an electrically non-conductive state with a high degree of reliability. In addition, when the over-voltage is detected, the NPN transistor 94 is put in a cut-off state. At that time, the NPN transistor 94 bears a voltage applied between the collector and emitter of its own. Thus, an operation can be carried out to protect the P-channel MOSFET 37 against an over-voltage lower than the withstand voltage of the NPN transistor 94.

The present invention is not limited to the embodiments explained above by referring to the diagrams. For example, the embodiments can be modified or extended as follows.

The threshold value of the over-voltage detection does not have to be 20V. That is, the threshold value can be set properly at a level, which varies from design to design.

In addition, an IGBT can be used as a semiconductor switching-device.

When the microcomputer 8 is capable of operating at a high speed, the detection signal generated by the over-voltage detection circuit 11 can be supplied to the microcomputer 8, which then outputs a command to put all the FETs 2 to 5 in an electrically non-conductive state.

The present invention is also not limited to the application to drive the DC motor 6 for opening and closing the throttle valve. For example, the present invention can also be applied to an application to drive another actuator such as the actuator of another DC motor mounted on a vehicle. In addition, the present invention is also not limited to applications to vehicles. That is, the scope of the present invention includes a wide range of applications including other DC motors and components bearing direct-current loads.

In the case of the seventh to ninth embodiments, the over-voltage detected by the over-voltage detection circuit 62 can be set at a level higher than the withstand voltage of the P-channel MOSFET 37 employed in the H bridge circuit by changing the Zener voltage of the Zener diode. That is, even if the level of the over-voltage is set in this way, the protection operation of the driving circuit 87 and others can be carried out immediately so that the FETs are not damaged. By setting the detection level at a high value, the protection operation can be prevented from being carried out frequently.

The resistor 81 can be provided only if required.

When over-voltages to be detected can be assumed to be over-voltages at low levels, devices composing the driving circuit 87 and others can each be created as a device having the junction separation structure.

In the case of the ninth embodiment, a Zener diode can be connected between the collector and base of the NPN transistor 94.

What is claimed is:

1. A driving apparatus for driving an H bridge circuit, comprising:
   a driving circuit for outputting a driving signal to a semiconductor switching-device included in the H bridge circuit;
   an over-voltage detection circuit for detecting an over-voltage applied to the H bridge circuit; and
   a control circuit for controlling the driving circuit to output a driving signal to all semiconductor switching-devices included in the H bridge circuit to put the semiconductor switching-devices in an electrically non-conductive state, wherein:
   the H bridge circuit includes a P-channel MOSFET as a semiconductor switching-device provided on a power supply side;
   the driving circuit includes a power supply side driving device disposed between a power supply and a gate of the P-channel MOSFET, and a ground side driving device disposed between the gate and the ground, wherein:
     the driving circuit drives the P-channel MOSFET by selectively putting either the power supply side driving device or the ground side driving device in an electrically conductive state;
     when the over-voltage detection circuit detects an over-voltage, the power supply side driving device is put in an electrically conductive state; and
     when the over-voltage detection circuit detects an over-voltage, the ground side driving device is put in an electrically non-conductive state; and
   the driving circuit further includes a Zener diode, which is connected between a power-supply-side terminal and an electrical-conduction control terminal of the ground side driving device, wherein the Zener diode has a Zener voltage not higher than a withstand voltage of the ground side driving device.

2. The driving apparatus of claim 1, wherein the driving circuit further comprises a resistor connected between the power supply side driving device and the ground side driving device.

3. A driving apparatus for driving an H bridge circuit, comprising:
a driving circuit for outputting a driving signal to a semiconductor switching-device included in the H bridge circuit;
an over-voltage detection circuit for detecting an over-voltage applied to the H bridge circuit;
a control circuit for controlling the driving circuit to output a driving signal to all semiconductor switching-devices included in the H bridge circuit to put the semiconductor switching-devices in an electrically non-conductive state, wherein:
the H bridge circuit includes a P-channel MOSFET as a semiconductor switching-device provided on a power supply side;
the driving circuit includes a power supply side driving device disposed between a power supply and a gate of the P-channel MOSFET, and a ground side driving device disposed between the gate and the ground, wherein:
the driving circuit drives the P-channel MOSFET by selectively putting either the power supply side driving device or the ground side driving device in an electrically conductive state;
when the over-voltage detection circuit detects an over-voltage, the power supply side driving device is put in an electrically conductive state; and
when the over-voltage detection circuit detects an over-voltage, the ground side driving device is put in an electrically non-conductive state;
a first switching device, which is put in an electrically conductive state when the over-voltage detection circuit detects an over-voltage;
a second switching device, which is provided between the power supply and an electrical-conduction control terminal of the power supply side driving device and is put in an electrically conductive state when the first switching device is put in an electrically conductive state;
a first Zener diode, which is provided between a power-supply side terminal and electrical-conduction control terminal of the first switching device and has a Zener voltage not higher than the withstand voltage of the first switching device; and
a second Zener diode, which is provided between a power-supply side terminal and electrical-conduction control terminal of the second switching device and has a Zener voltage not higher than the withstand voltage of the second switching device, wherein a voltage appearing between terminals of the second switching device as a voltage drop generated at the electrical-conduction control terminal of the power supply side driving device when the second switching device is in an electrically conductive state, is set at a value causing an electrical potential appearing at the gate of the P-channel MOSFET to become at least equal to a cut-off level.

4. A driving apparatus for driving an H bridge circuit, comprising:
a driving circuit for outputting a driving signal to a semiconductor switching-device included in the H bridge circuit;
an over-voltage detection circuit for detecting an over-voltage applied to the H bridge circuit; and
a control circuit for controlling the driving circuit to output a driving signal to all semiconductor switching-devices included in the H bridge circuit to put the semiconductor switching-devices in an electrically non-conductive state, wherein:
the H bridge circuit includes a P-channel MOSFET as a semiconductor switching-device provided on a power supply side;
the driving circuit includes a power supply side driving device disposed between a power supply and a gate of the P-channel MOSFET, and a ground side driving device disposed between the gate and the ground, wherein:
the driving circuit drives the P-channel MOSFET by selectively putting either the power supply side driving device or the ground side driving device in an electrically conductive state;
when the over-voltage detection circuit detects an over-voltage, the power supply side driving device is put in an electrically conductive state; and
when the over-voltage detection circuit detects an over-voltage, the ground side driving device is put in an electrically non-conductive state; and
the over-voltage detection circuit is a series circuit connected between the power supply and the ground comprising a resistor disposed on the power supply side, a Zener diode and a resistor disposed on the ground side; and
the control circuit is a cut-off control-switching device, which is put in an electrically conductive state accompanying electrical conduction of the Zener diode in the event of a detected over-voltage and sets a signal supplied to a control-signal input terminal of the driving circuit at the same level as a level required to put the P-channel MOSFET in an electrically non-conductive state.

* * * * *